(12) United States Patent
Cheng et al.

(10) Patent No.: US 8,368,147 B2
(45) Date of Patent: Feb. 5, 2013

(54) STRAINED SEMICONDUCTOR DEVICE WITH RECESSED CHANNEL

(75) Inventors: Chun-Fai Cheng, Hsin-Chu (TW);
Ka-Hing Fung, Hsin-Chu (TW);
Han-Ting Tsai, Kaoshiung (TW);
Ming-Huan Tsai, Hsin-Chu (TW);
Wei-Han Fan, Hsin-Chu (TW);
Hsueh-Chang Sung, Zhubei (TW);
Haiting Wang, Hsin-Chu (TW);
Wei-Yuan Lu, Taipei (TW);
Hsien-Ching Lo, Taoyuan (TW);
Kuan-Chung Chen, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 173 days.

(21) Appl. No.: 12/761,949

(22) Filed: Apr. 16, 2010

(65) Prior Publication Data

US 2011/0254105 A1    Oct. 20, 2011

(51) Int. Cl.
*H01L 21/70* (2006.01)

(52) U.S. Cl. ........ 257/369; 257/190; 257/192; 257/627; 257/628; 438/199

(58) Field of Classification Search .................. 257/369, 257/190, 192, 627, 628, 254, 408, E29.193; 438/199

See application file for complete search history.

(56) References Cited

U.S. PATENT DOCUMENTS

| 6,225,173 | B1 | 5/2001 | Yu |
| 6,716,046 | B2 | 4/2004 | Mistry |
| 2009/0001484 | A1 | 1/2009 | Feudel et al. |
| 2009/0065809 | A1* | 3/2009 | Yamakawa .................... 257/190 |
| 2010/0295127 | A1* | 11/2010 | Cheng et al. ................... 257/347 |

OTHER PUBLICATIONS

Auth, C., et al., "45nm High-k + Metal Gate Strain-Enhanced Transistors," Symposium on VLSI Technology Digest of Technical Papers, 2008, pp. 128-129.
Auth, C., et al., "45nm High-k+Metal Gate Strain-Enhanced Transistors," Intel Technology Journal, vol. 12, Issue 2, Jun. 17, 2008, pp. 77-86.
Wang, J., et al., "Novel Channel-Stress Enhancement Technology with eSiGe S/D and Recessed Channel on Damascene Gate Process," Symposium on VLSI Technology Digest of Technical Papers, 2007, pp. 46-47.

* cited by examiner

*Primary Examiner* — Tom Thomas
*Assistant Examiner* — Faird Khan
(74) *Attorney, Agent, or Firm* — Slater & Matsil, L.L.P.

(57) ABSTRACT

A semiconductor device having a strained channel and a method of manufacture thereof is provided. The semiconductor device has a gate electrode formed over a channel recess. A first recess and a second recess formed on opposing sides of the gate electrode are filled with a stress-inducing material. The stress-inducing material extends into an area wherein source/drain extensions overlap an edge of the gate electrode. In an embodiment, sidewalls of the channel recess and/or the first and second recesses may be along {111} facet planes.

12 Claims, 3 Drawing Sheets

STRAINED SEMICONDUCTOR DEVICE WITH RECESSED CHANNEL

TECHNICAL FIELD

This invention relates generally to semiconductor devices and, more specifically, to the formation of CMOS transistors having a recessed channel.

BACKGROUND

Size reduction of metal-oxide-semiconductor field-effect transistors (MOSFETs), including reduction of the gate length and gate oxide thickness, has enabled the continued improvement in speed, performance, density, and cost per unit function of integrated circuits over the past few decades. To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NMOSFET) or for p-channel (PMOSFET) devices. Generally, it is desirable to induce a tensile strain in the n-channel of an NMOSFET transistor in the source-to-drain direction to increase electron mobility and to induce a compressive strain in the p-channel of a PMOSFET transistor in the source-to-drain direction to increase hole mobility. There are several existing approaches of introducing strain in the transistor channel region.

In one approach, strain in the channel region is introduced by creating a recess in the substrate in the source/drain regions. For example, a PMOS device having a compressive stress in the channel region may be formed on a silicon substrate by epitaxially growing a stress-inducing layer having a larger lattice structure than the silicon, such as a layer of SiGe, within recessed regions in the source/drain regions. Similarly, an NMOS device having a tensile stress in the channel region may be formed on a silicon substrate by epitaxially growing a stress-inducing layer having a smaller lattice structure than the silicon, such as a layer of SiC, within recessed regions in the source/drain regions.

In this approach, the stress-inducing layer is limited to the more heavily-doped regions of the source/drain regions. As a result, there is little or no contribution to stress in the channel region from the source/drain extension regions or the overlapping region between the gate electrode and the source/drain extensions.

SUMMARY

These and other problems are generally reduced, solved, or circumvented, and technical advantages are generally achieved, by embodiments discussed herein, which provides a strained semiconductor device having a recessed channel region.

In an embodiment, a semiconductor device is provided. The semiconductor device includes a substrate, a gate dielectric over the substrate, and a gate electrode over the gate dielectric. The gate electrode is positioned in a recess in the substrate. Source/drain regions on opposing sides of the gate electrode include a stress-inducing material such that the stress-inducing material extends into a region wherein source/drain extensions overlap the gate electrode. The recess under the gate electrode may have sidewalls with a {111} surface orientation, a U-shaped profile, or the like.

In another embodiment, a method of forming a semiconductor device having a strained channel region is provided. A substrate having a dummy gate electrode and a first recess and a second recess on opposing sides of the dummy gate electrode is provided. The first and second recesses are filled with a stress-inducing material. The dummy gate electrode is removed and a third recess is formed between the first recess and the second recess. A gate dielectric is formed along the bottom of the third recess, and a gate electrode is formed over the gate dielectric. The first recess and the second recess extend under the gate electrode into an area wherein source/drain extensions overlap edges of the gate electrode.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use embodiments, and do not limit the scope of this disclosure.

As will be explained in greater detail below, embodiments discussed herein utilize a stress-inducing layer in the source and drain regions. The stress-inducing layer extends into the source/drain extension (SDE) regions, thereby exerting a greater amount of stress in a channel region. Furthermore, the channel region itself is recessed, creating raised SDE regions that extend above a bottom surface of a gate dielectric layer. As a result, some embodiments may improve short channel effects while increasing the drive current $I_{on}$.

Figure 1:
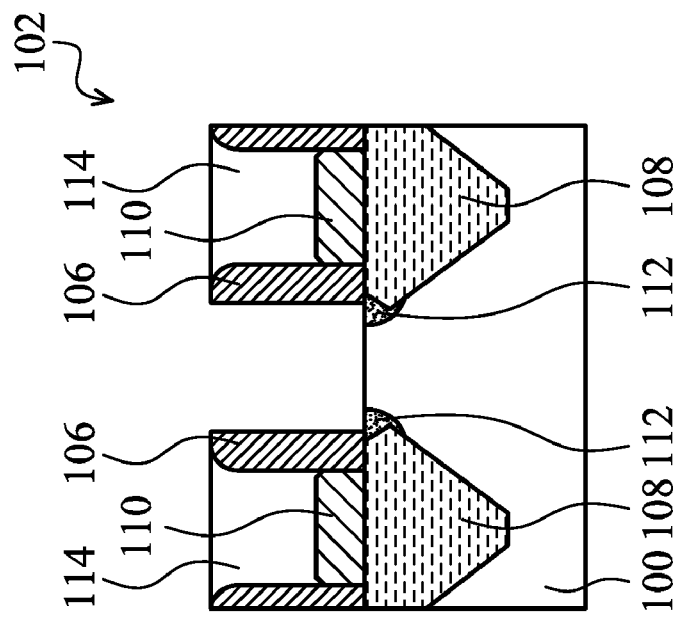
FIGS. 1-4 illustrate intermediate stages of forming a semiconductor device in accordance with an embodiment.

FIGS. 1-4 illustrate a method for fabricating a semiconductor device having a strained recessed channel region in accordance with an embodiment. Referring first to FIG. 1, a portion of a substrate 100 having a transistor 102 formed thereon is shown in accordance with an embodiment. The substrate 100 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. The substrate may alternatively be a Ge substrate, a SiGe substrate, a group III-V substrate, or the like.

As will be discussed in greater detail below, a recess is formed in the substrate in the source/drain regions, and it may be desirable for sidewalls of the recess to have a {111} surface orientation. To achieve this {111} surface orientation for the recess sidewall, it may also be desirable for the substrate 100 to have a (110) or a (100) surface orientation. Other orientations, however, may also be used.

The transistor 102 includes a dummy gate electrode 104 and spacers 106 formed alongside the dummy gate electrode 104. The dummy gate electrode 104 may be formed of any suitable material. It may be desirable, however, that the material used to form the dummy gate electrode 104 have a high etch selectivity relative to the material used to form the spacers 106 because, as explained in greater detail below, the dummy gate electrode 104 is removed in subsequent processing steps. In an embodiment, amorphous silicon is deposited and recrystallized to create poly-crystalline silicon (poly-silicon). In an embodiment in which the dummy gate electrode is poly-silicon, the dummy gate electrode 104 may be formed by depositing doped or undoped poly-silicon by low-pressure chemical vapor deposition (LPCVD) to a thickness in the range of about 200 Å to about 1000 Å. In this manner, a dummy gate electrode may be formed simultaneously or separately from an actual gate electrode elsewhere on the substrate 100, allowing for devices with different operating characteristics on a single wafer/die. It should be noted that a dummy gate dielectric layer 105 interposed between the substrate 100 and the dummy gate electrode 104 may be used if desired as illustrated in FIG. 1. In some embodiments, the use of the dummy gate dielectric layer 105 may provide better etch selectivity than between the dummy gate electrode 104 and the substrate 100 during removal of the dummy gate electrode 104. If desired, the dummy gate dielectric layer 105 may comprise any suitable dielectric layer, including materials having a high etch selectivity with the substrate 100, such as silicon dioxide ($SiO_2$), silicon oxynitride (SiON), hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, and/or combinations thereof.

The spacers 106 may be formed by depositing and patterning a dielectric layer. In an embodiment, the dielectric layer includes a nitride layer on an oxide layer. In alternative embodiments, the dielectric layer may include a single layer or more than two layers, each comprising oxide, silicon nitride, silicon oxynitride (SiON) and/or other dielectric materials. The dielectric layer may be formed using any suitable technique, such as plasma enhanced chemical vapor deposition (PECVD), low-pressure chemical vapor deposition (LPCVD), sub-atmospheric chemical vapor deposition (SACVD), and the like. The dielectric layer is then patterned to form spacers 106, wherein the patterning may be performed by either wet etching or dry etching. Horizontal portions of the dielectric layer are removed, and the remaining portions form spacers 106 as illustrated in FIG. 1. It should be noted that only a single spacer is shown for illustrative purposes, and that multiple spacers, liners, and/or the like, may be used to obtain the desired doping profile in the source/drain regions.

Also shown in FIG. 1 are stressed regions 108 in the source/drain regions on opposing sides of the dummy gate electrode 104. In accordance with an embodiment, the stressed regions 108 are formed of a stress-inducing material that causes a strained channel region. For example, a PMOS device having a compressive stress in the channel region may be formed on a silicon substrate by epitaxially growing a stress-inducing material having a larger lattice structure than the silicon, such as a layer of SiGe, within recessed regions in the source/drain regions. Similarly, an NMOS device having a tensile stress in the channel region may be formed on a silicon substrate by epitaxially growing a stress-inducing material having a smaller lattice structure than the silicon, such as a layer of SiC, within recessed regions in the source/drain regions.

The recesses may be formed by using a crystal surface selective wet etch process using, for example, tetra-methyl ammonium hydroxide (TMAH) solution in a volume concentration range of 1% to 10% and a temperature range of 15° C. to 50° C. In alternative embodiments, other crystal surface selective wet etching solutions for (100) silicon substrates, such as ammonium hydroxide ($NH_4OH$), potassium hydroxide (KOH) or amine-based etching solution may also be used. The selective wet etch results in the {111} surfaces of silicon substrate 100 to be exposed with sidewalls of the recesses having {111} surface orientations. It should be noted that the location of the recesses, and hence the position of the stress-inducing material, may be adjusted as desired for a particular application. In an embodiment, stressed regions 108 extend under the dummy gate electrode 104.

The contact surfaces of the stressed regions 108 may be silicided, thereby forming silicide regions 110. As is known in the art, silicide regions 110 may be formed by blanket depositing a thin layer of metal, such as nickel, platinum, cobalt, and combinations thereof. The substrate 100 is then heated, causing the silicon to react with the metal where contacted. After the reaction, a layer of metal silicide is formed. The un-reacted metal is selectively removed through the use of an etchant that attacks metal but does not attack silicide.

FIG. 1 further illustrates SDEs 112, e.g., lightly-doped drains (LDDs). In an embodiment, the stressed regions 108 extend into the SDEs 112, thereby providing additional stress in the SDE and channel region. As illustrated in FIG. 1, the SDEs 112 and the stressed regions 108 extend under the gate electrode, such that the stressed regions 108 extend into an area wherein the SDEs 112 overlap an edge of the dummy gate electrode 104. In an embodiment, the stressed regions 108 extend past the dummy gate electrode 104 by a distance of about 20 Å to about 100 Å

It should be noted that the source/drain regions may include any suitable doping profile, and may be formed using any suitable process, including any suitable use of spacers, liners, and/or sacrificial liners/spacers. For example, SDEs and heavily-doped regions may be formed in situ or after formation of the stressed source/drain regions with the use of the spacers 106 and/or different spacers and/or additional spacers. As another example, both the SDEs and the heavily-doped regions may be formed after forming recesses by, for example, implantation, diffusion, or the like. Furthermore, other doped regions, such as wells, halo/pocket implants, and/or the like, may also be used.

A dielectric layer 114 is formed over the substrate 100 such that the dummy gate electrode 104 is exposed. The dielectric layer 114 may comprise any suitable dielectric materials, such as those having a dielectric constant (K) of about 4.0 or less. Suitable materials that may be used to form the dielectric layer 114 include silicon oxide or dioxide, diamond-like carbon, fluorinated silicate glass or fluorinated silicon oxide glass (FSG), $SiO_xC_y$, Spin-On-Glass, Spin-On-Polymers, silicon carbon material, compounds thereof, composites thereof, combinations thereof, or the like. The dielectric layer 114 may comprise a plurality of layers, including one or more etch stop layers.

The dielectric layer 114 may be formed by any suitable method. In an embodiment, the dielectric layer 114 comprises an oxide that may be formed by CVD techniques using tetra-ethyl-ortho-silicate (TEOS) and oxygen as a precursor. In an embodiment, the dielectric layer 114 is formed to a thickness sufficient to cover the transistor 102 and a planarizing process, such as a chemical mechanical polish (CMP) is performed to planarize the surface and expose the dummy gate electrode 104.

Figure 2:
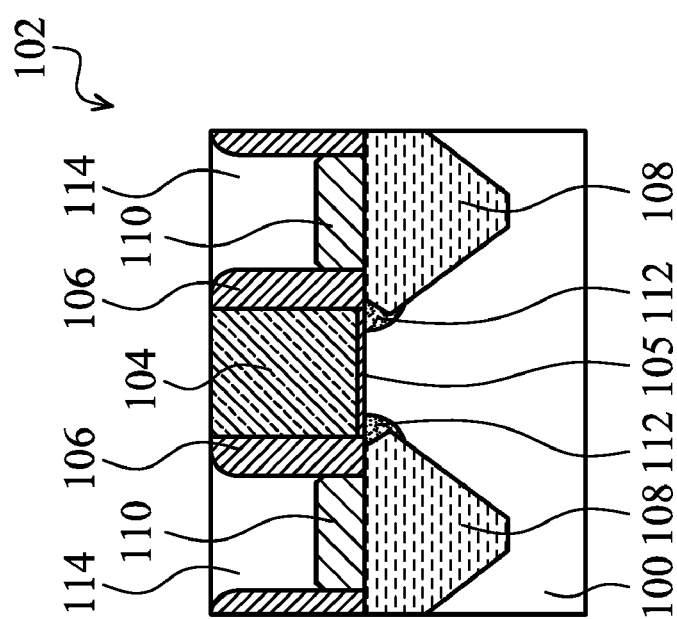

Referring now to FIG. 2, the dummy gate electrode 104 and the dummy gate dielectric layer 105 (see FIG. 1) are removed. In an embodiment in which the dummy gate electrode 104 is formed of polysilicon, an etching process using, for example, TMAH, ammonia hydroxide, or the like, may be used. The etching process should be selected such that the dummy gate electrode 104 is removed without substantially damaging the SDEs 112 and/or the spacers 106. The dummy gate dielectric layer 105, if present, may be removed by, for example, hydrofluoric acid (HF) to expose a surface of the substrate 100. A portion of the dielectric layer 114 may be removed during the removal of the dummy gate dielectric layer 105. Alternatively, a protective layer, such as a layer of silicon nitride, may be formed over the dielectric layer 114 to protect the dielectric layer 114 during the removal of the dummy gate dielectric 105.

Figure 3:
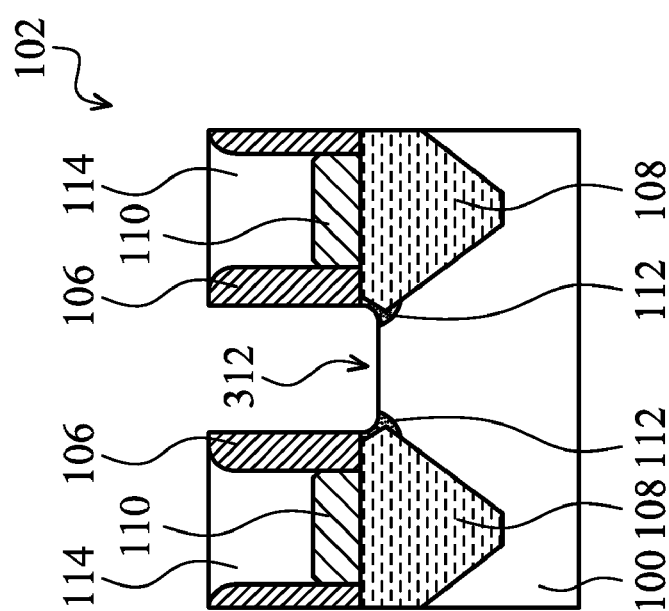

FIG. 3 illustrates formation of a channel recess 312 in accordance with an embodiment. The channel recess 312 may be formed by, for example, a wet etch using a KOH solution, such as a KOH solution having about a 45% volume percentage of KOH dissolved in water, or TMAH. An etch process such as this exhibits a higher etch rate between the (100) and (110) planes relative to the {111} facet planes. As a result, the sidewalls of the channel recess 312 will be along the {111} facet planes as illustrated in FIG. 3. In an embodiment, the channel recess 312 has a depth of about 2 nm to about 12 nm, such as about 5 nm. As illustrated in FIG. 3, the channel recess 312 allows for the SDEs 112 to have a top surface above a bottom surface of the channel recess 312, thereby creating raised SDEs. Furthermore, in an embodiment, a top surface of the stress-inducing material extends above the bottom surface of the channel recess 312.

In an embodiment, the channel recess 312 does not extend to the stressed regions 108 to prevent or reduce any problems that may be caused by the gate dielectric formed in subsequent processing steps directly contacting the material of the stressed regions 108. In the embodiment discussed above in which a solution such as KOH or TMAH is used to etch to expose a {111} facet plane, the offset from the etching positions results in a layer of the substrate 100 being interposed between the stressed regions 108 and the channel recess 312. In a TCAD simulation using a PMOS transistor having a germanium component of about 40 atomic %, a relative stress-induced drive current gain of the transistor 102 can be increased by about 10% in comparison with a conventional transistor. In another electrical simulation MEDICI, a pocket/halo implant can be significantly reduced while obtaining about 9% increase in the drive current $I_{on}$ and 15 mV drain induced barrier lowering (DIBL) with a minimum gate length of 24 nm. It will be appreciated that under these conditions, short channel effects can be reduced.

Figure 4:
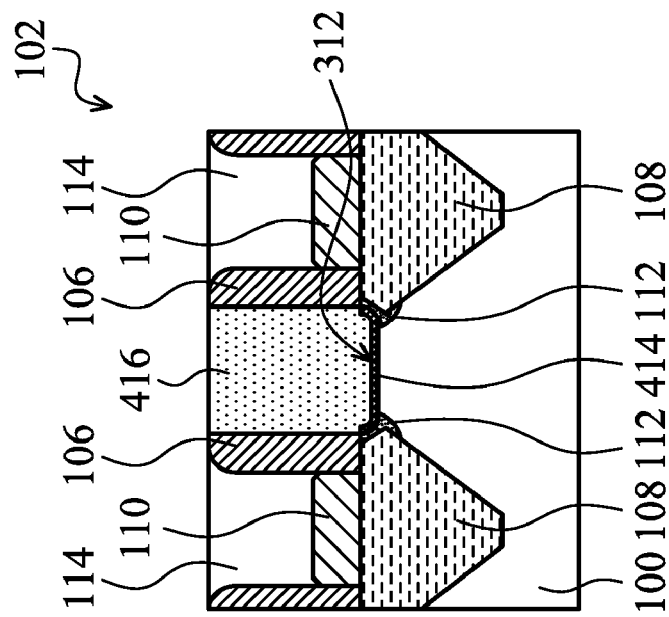

Thereafter, as illustrated in FIG. 4, a gate dielectric layer 414 and a gate electrode 416 are formed. The gate dielectric layer 414 can include at least one material such as oxide, nitride, oxynitride, and other gate dielectric material. In embodiments, the gate dielectric layer 414 can include an interfacial layer, e.g., a silicon oxide layer, and a high-k dielectric layer disposed over the interfacial layer. In embodiments, the high-k dielectric layer may include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, and/or combinations thereof. The gate dielectric layer 414 is about 10 Å to about 50 Å in thickness.

The gate electrode 416 may comprise a conductive material, such as a metal (e.g., tantalum, titanium, molybdenum, tungsten, platinum, aluminum, hafnium, or ruthenium), a metal silicide (e.g., titanium silicide, cobalt silicide, nickel silicide, or tantalum silicide), a metal nitride (e.g., titanium nitride or tantalum nitride), doped poly-crystalline silicon, other conductive materials, or a combination thereof.

Depending on the process utilized to form the gate dielectric layer 414 and the gate electrode 416, it may be desirable to perform a planarization process. In particular, some methods of deposition, such as a CVD process, form a conformal layer, and as a result, it may be desirable to perform a planarization process, such as a grinding or CMP process, to create a planar surface as illustrated in FIG. 4. If another method such as masking and electroplating is used, a CMP process may not be necessary.

Thereafter, other back-end-of-line (BEOL) processing techniques suitable for the particular application may be performed. For example, metallization/inter-metal dielectric layer processes, an interconnect structure process, an encapsulant process, a singulation process, and/or the like, may be performed.

Figure 6:
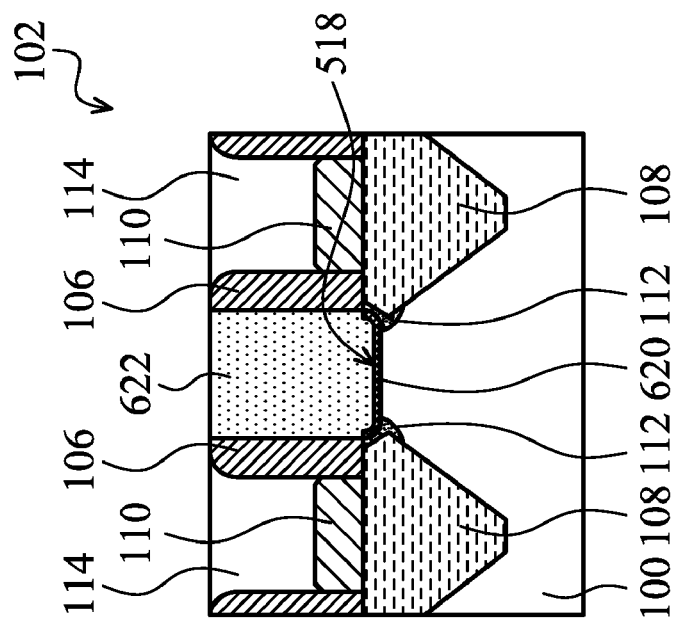
FIGS. 5 and 6 illustrate intermediate stages of forming a semiconductor device in accordance with another embodiment.
Figure 5:
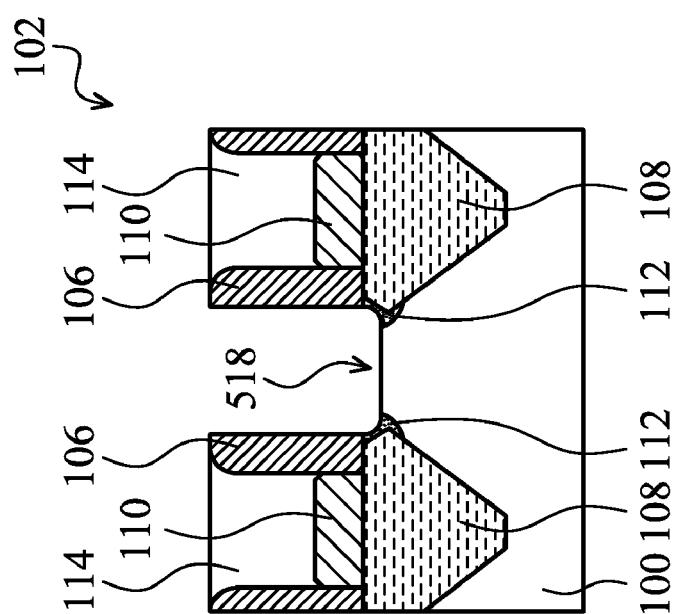

FIGS. 5 and 6 illustrate a method of forming a semiconductor device in accordance with another embodiment. The process depicted in FIGS. 5 and 6 assumes that a process similar to that discussed above with reference to FIGS. 1 and 2 has been previously performed. As such, after FIG. 2, FIG. 5 illustrates a process of forming a channel recess 518 using a plasma-like dry etch process in Transformer-Coupling-Plasma (TCP) using HBr in He and O2 ambient with a flow rate in 5~50 sccm, a pressure in 1~20 mtorr, a bias voltage in 30~100V. Using a process such as this, the channel recess 518 exhibits a U-shaped profile as a result of the etch process not being as selective between the different crystal orientations as the etch process discussed above with reference to FIG. 3.

Thereafter, as illustrated in FIG. 6, a gate dielectric 620 and a gate electrode 622 may be formed. The gate dielectric 620 and the gate electrode 622 may be formed using similar processes and similar materials used to form the gate dielectric layer 414 and the gate electrode 416, respectively, discussed above with reference to FIG. 4.

Thereafter, other BEOL processing techniques suitable for the particular application may be performed. For example, metallization/inter-metal dielectric layers processes, an interconnect structure process, an encapsulant process, a singulation process, and the like, may be performed.

It should be appreciated that embodiments such as those described above may exhibit substantially more stress in the channel region than other types of known systems, such as systems utilizing stressed regions having a tip extending below the SDE regions and even those systems utilizing a stressed region having a raised tip closer to an upper surface of the substrate, but that does not substantially extend into a region wherein the SDE region overlaps the gate electrode. It has been found that the embodiments discussed above may exhibit a higher and more uniform stress in the channel region as compared to the other known systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate;
    a gate dielectric over the substrate;
    a gate electrode over the gate dielectric, the gate electrode being positioned above a first recess in the substrate; and
    source/drain regions in the substrate on opposing sides of the gate electrode, the source/drain regions comprising a stress-inducing material in a second recess and a third recess in the substrate on opposing sides of the gate electrode, the source/drain regions comprising raised source/drain extensions (SDEs) such that a top surface of the SDEs extend above a bottom surface of the first recess, the second recess and the third recess extending into an area wherein the SDEs overlap the gate electrode, the area being below the gate electrode.

2. The semiconductor device of claim 1, wherein the first recess is recessed about 5 nm from a top surface of the substrate.

3. The semiconductor device of claim 1, wherein a sidewall of the second and third recesses has a {111} surface orientation.

4. The semiconductor device of claim 1, wherein the stress-inducing material extends above a bottom surface of the gate electrode.

5. The semiconductor device of claim 1, wherein the first recess has a sidewall along {111} facet planes.

6. The semiconductor device of claim 1, wherein the first recess has a U-shaped profile.

7. A semiconductor device comprising:
    a substrate having a recess formed therein and stress-inducing regions on opposing sides of the recess, the stress inducing regions extending into an area below the recess;
    a gate dielectric in the recess;
    a gate electrode over the gate dielectric; and
    source/drain regions in the substrate on opposing sides of the gate electrode, the source/drain regions comprising raised source/drain extensions (SDEs) such that the recess extends below a top surface of the raised SDEs.

8. The semiconductor device of claim 7, wherein the recess is recessed about 5 nm from a top surface of the substrate.

9. The semiconductor device of claim 7, wherein a sidewall of the stress-inducing regions has a {111} surface orientation.

10. The semiconductor device of claim 7, wherein the stress-inducing regions extend above a bottom surface of the gate electrode.

11. The semiconductor device of claim 7, wherein the recess has a sidewall along {111} facet planes.

12. The semiconductor device of claim 7, wherein the recess has a U-shaped profile.

* * * * *